United States Patent [19]
Yu et al.

[11] Patent Number: 6,116,920
[45] Date of Patent: Sep. 12, 2000

[54] ALIGNMENT SOCKET FOR PCMCIA CARD CONNECTOR

[75] Inventors: Hung-Chi Yu, Hsi-Chih; Ming-Chun Lai, Hsin-Chuang, both of Taiwan

[73] Assignee: Hon Hai Precision Ind. Co., Ltd., Taipei Hsien, Taiwan

[21] Appl. No.: 09/360,769

[22] Filed: Jul. 26, 1999

[30] Foreign Application Priority Data

May 25, 1999 [TW] Taiwan .................................. 88208418

[51] Int. Cl.⁷ .................................................. H01R 12/20
[52] U.S. Cl. .............................................. 439/79; 439/682
[58] Field of Search ................................... 439/79, 541.5, 439/64, 682

[56] References Cited

U.S. PATENT DOCUMENTS

| | | | |
|---|---|---|---|
| 5,286,207 | 2/1994 | McHugh | 439/541.5 |
| 5,601,438 | 2/1997 | Ho et al. | 439/541.5 |
| 5,667,401 | 9/1997 | Kuwabara et al. | 439/682 |
| 5,688,130 | 11/1997 | Huang | 439/541.5 |
| 5,971,784 | 10/1999 | Fabian et al. | 439/224 |

*Primary Examiner*—Gary F. Paumen
*Attorney, Agent, or Firm*—Wei Te Chung

[57] ABSTRACT

A card connector comprises an elongate header, a number of terminals retained in the header, an alignment socket for interconnecting the terminals with a printed circuit board, and a grounding plate covering the header and the alignment socket. The alignment socket has a step-like configuration and comprises a plurality of passages arranged in a front row and a rear row for receiving the terminals. By such a design, the length of the card connector is significantly reduced thereby reducing occupied area of the card connector on the circuit board.

3 Claims, 4 Drawing Sheets

ALIGNMENT SOCKET FOR PCMCIA CARD CONNECTOR

BACKGROUND OF THE INVENTION

1. Field of the Invention

The present invention relates to a PCMCIA card connector, and particularly to a step-like alignment socket for a PCMCIA connector for reducing the length of the connector thereby reducing occupied area of the connector on a printed circuit board.

2. Description of Prior Art

As the popularity of notebook computers increases, IC (integrated circuit) cards are becoming more common for increasing storage capacity and processing speed of stored data. Presently, many notebook computers require the cards to be inserted in a peripheral device such as a hard disk drive (HDD). Thus, card connectors are commonly used to connect the computer with the peripheral device. Most current IC cards and card connectors conform to the standards of PCMCIA (Personal Computer Memory Card Industry Association).

A PCMCIA card connector typically comprises a header adapted for accommodating a PCMCIA card with a plurality of passageways defined therein and arranged in rows for receiving a corresponding number of terminals. Each terminal comprises a contact portion for mating with a corresponding contact of an inserted card, and a tail portion downwardly extending from the header for connecting with a printed circuit board (PCB). To retain the terminals in position, an alignment socket is used. Pertinent conventional alignment sockets of PCMCIA card connectors are disclosed in U.S. Pat. Nos. 5,601,438, 5,286,207 and 5,688,130.

Referring to FIG. 1, a conventional alignment socket 12 for use with a PCMCIA card connector 1 is shown. The alignment socket 12 has a significant height and defines a plurality of passages 13 therethrough with a corresponding number of female terminals 130 retained therein. The connector 1 comprises an elongate header 10 with a plurality of terminals 100 arranged in upper and lower rows received therein, and a grounding plate 101 covering the header 10 and the alignment socket 12. Each terminal 100 rearwardly extends into the corresponding passageway 13 of the alignment socket 12 for engaging with a contact portion 131 of the corresponding female terminal 130. A solder portion 132 of each female terminal 130 is adapted for being surface mounted to a PCB (not shown) thereby interconnecting the connector 1 therewith.

Since the alignment socket 12 has a significant height, the terminals 100 must be upwardly bent a distance H to cooperate with the alignment socket 12 thereby preventing the formation of a short circuit between upper and lower terminals 100 during insertion into the corresponding passages 13 of the alignment socket 12. Similarly, the grounding plate 101 must be upwardly bent a distance substantially equal to the distance H to accommodate the upwardly bent terminals 100. A significant distance $D_1$ is defined between the header 10 and the alignment socket 12 thereby significantly increasing the length of the connector 1 and occupied area of the connector 1 on the PCB, which is out of line with the current miniaturization trend of the computer industry.

Therefore, an alignment socket which reduces the length of a card connector thereby significantly reducing the occupied area of the connector on a PCB is of value.

SUMMARY OF THE INVENTION

Accordingly, an object of the present invention is to provide an improved alignment socket for a PCMCIA card connector for reducing the length of the connector thereby reducing occupied area of the connector on a PCB.

In order to achieve the object set forth, a PCMCIA card connector in accordance with the present invention comprises an elongate header, a plurality of terminals retained in the header and arranged in upper and lower rows, an alignment socket for interconnecting the terminals with a printed circuit board, and a grounding plate covering the header and the alignment socket.

The alignment socket has a step-like shape and comprises upper and lower stepped surfaces each with a plurality of passages defined therein. A plurality of female terminals is retained in the passages. Each female terminal includes a contact portion for mating with a tail portion of the corresponding terminal of the header and a solder portion for being surface mounted to the PCB. The alignment socket further comprises a plurality of channels formed in a rear surface thereof with a shielding shell retained therein for engaging with corresponding grounding fingers downwardly extending from a rear edge of the grounding plate.

According to a first embodiment of the present invention, the tail portions of the terminals of the header are slightly bent upward for insertion into the corresponding passages of the alignment socket whereby the grounding plate covers the header without being bent upward. A distance defined between the header and the alignment socket is significantly reduced. According to a second embodiment of the present invention, the height of the header is slightly increased while maintaining the length of the connector whereby the tail portions of the terminals directly extend into the corresponding passages of the alignment socket. Thus, the length of the connector is decreased compared to conventional connectors thereby reducing occupied area of the connector on the PCB.

Other objects, advantages and novel features of the invention will become more apparent from the following detailed description when taken in conjunction with the accompanying drawings.

DETAILED DESCRIPTION OF THE EMBODIMENTS

Figure 1:
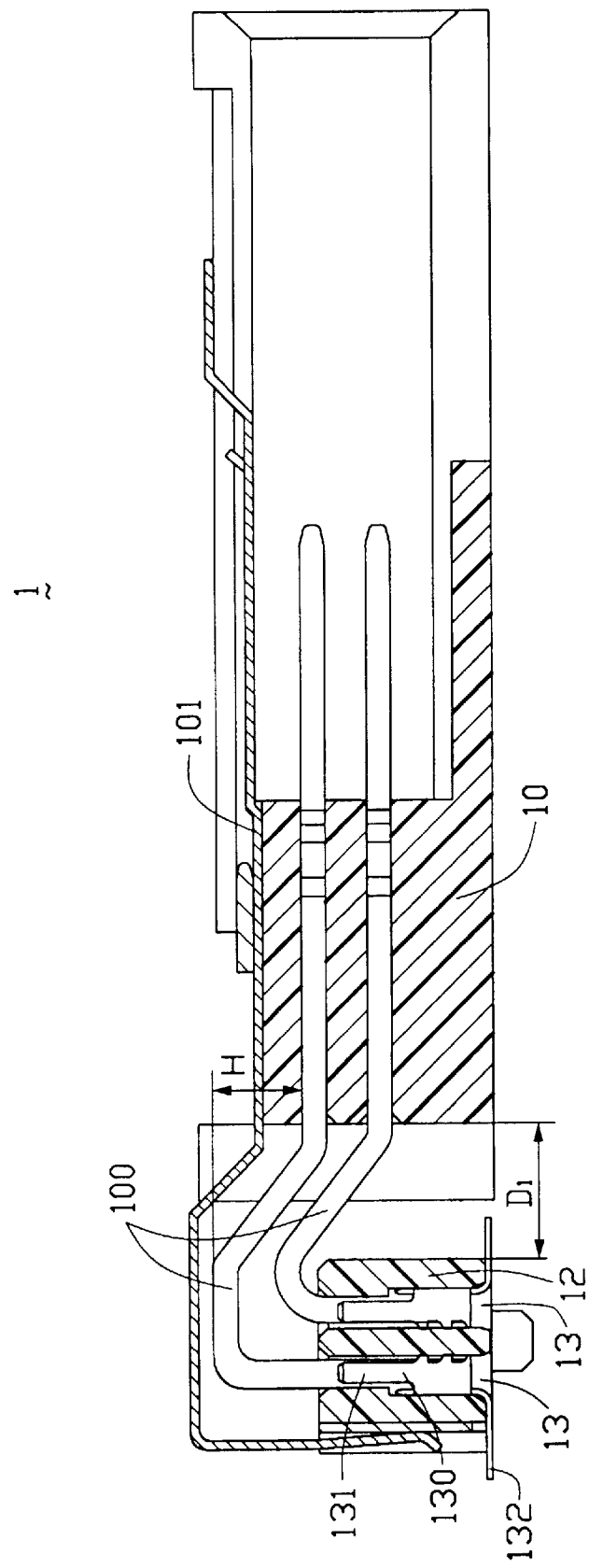
FIG. 1 is a vertical cross-sectional view of a PCMCIA card connector incorporating a conventional alignment socket.

Reference will now be made to the drawing figures to describe the present invention in detail.

Figure 2:
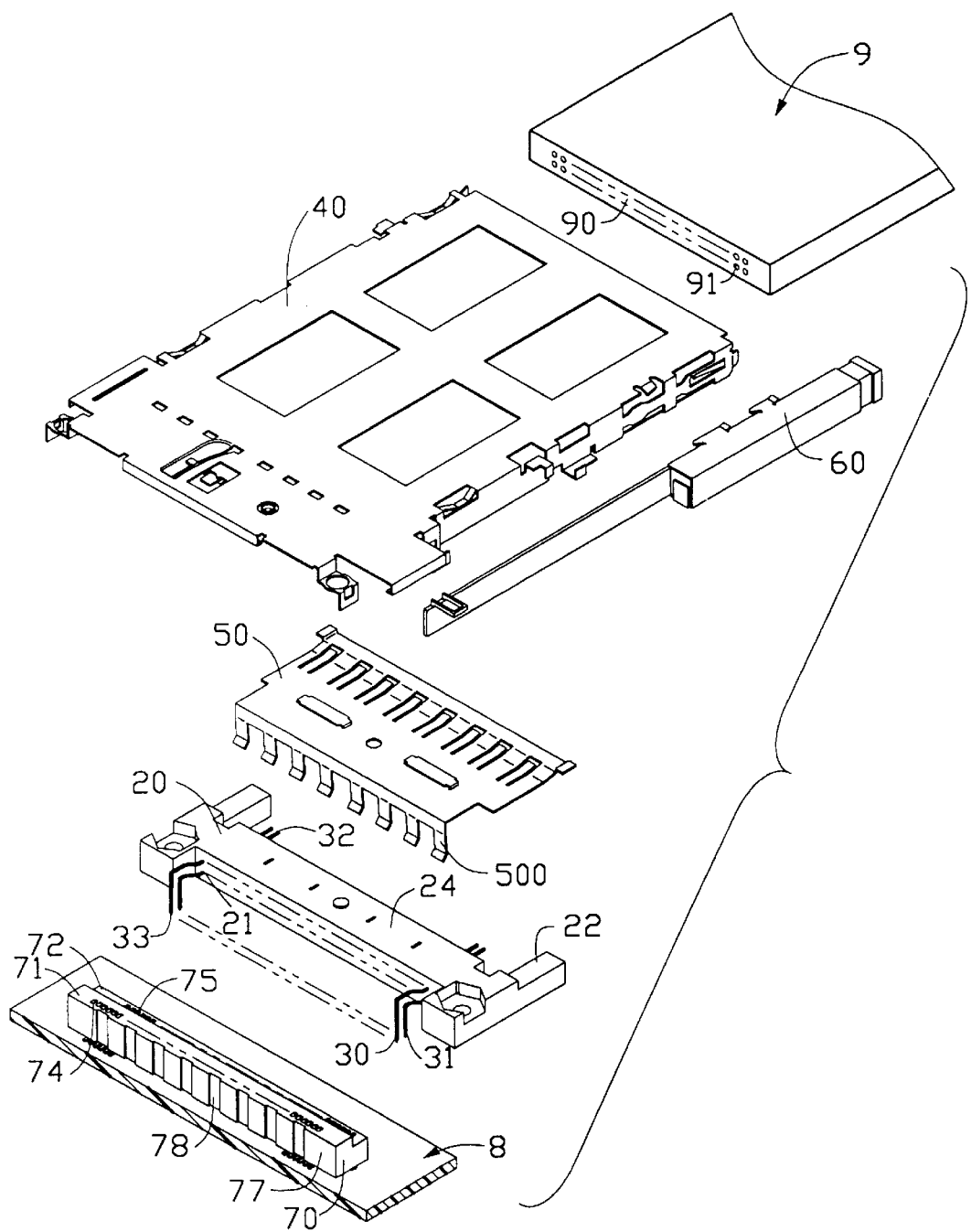
FIG. 2 is an exploded perspective view of a PCMCIA card connector incorporating an alignment socket mounted on a PCB in accordance with a first embodiment of the present invention, and a PCMCIA card adapted to be inserted into the connector.
Figure 3:
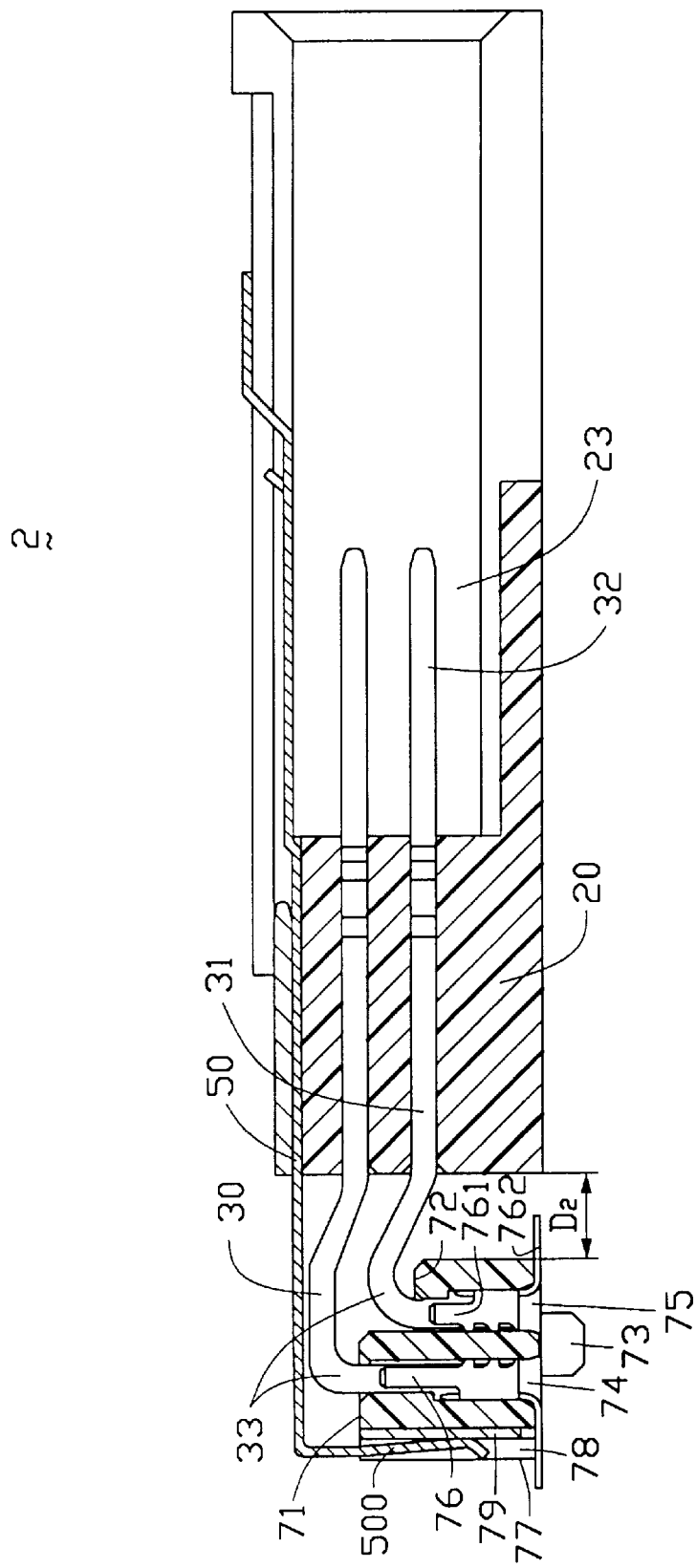
FIG. 3 is a vertical cross-sectional view of the assembled connector of FIG. 2.

A PCMCIA card connector 2 in accordance with a first embodiment of the present invention is shown in FIGS. 2 and 3. The card connector 2 adapted for accommodating a PCMCIA card 9 comprises an elongate header 20, a plurality of terminals 30, 31 received in the header 20, a shield 40 for shielding the terminals 30, 31 and the inserted card 9 from EMI/RFI (electromagnetic interference/radio frequency interference), a grounding plate 50 covering the header 20, a card ejection mechanism 60 mounted to one side of the shield 40, and an alignment socket 70 seated on a PCB 8.

A plurality of passageways 21 is defined in the header 20 for receiving the corresponding terminals 30, 31. A pair of opposite arms 22 forwardly extends from the header 20 to define a cavity 23 for receiving a front portion of the card 9. Each terminal 30, 31 is substantially L-shaped and includes a forwardly projecting pin portion 32 and a downwardly projecting tail portion 33. The pin portions 32 are adapted for insertion into corresponding receptacle contacts 91 of a receptacle connector 90 disposed on a front face of the card 9. It can be seen that the terminals 30, 31 are respectively arranged in upper and lower rows for mating with corresponding rows of the receptacle contacts 91 of the card 9. The grounding plate 50 is stamped and formed from conductive metal material and includes a plurality of grounding fingers 500 along a rear edge thereof.

The alignment socket 70 is adapted for interconnecting the tail portions 33 of the terminals 30, 31 with the PCB 8. The alignment socket 70 has a step-like shape and comprises an upper stepped surface 71 and a lower stepped surface 72 respectively defining a plurality of passages 74, 75 therein for receiving the corresponding upper and lower rows of terminals 30, 31. A plurality of female terminals 76 is retained in the passages 74, 75. Each female terminal 76 includes a contact portion 761 for engaging with the tail portion 33 of the corresponding terminal 30, 31, and a horizontal solder portion 762 extending out of the alignment socket 70 for being soldered to circuit traces on the PCB 8. A pair of mounting pegs 73 extends from a bottom surface of the alignment socket 70 for engaging with corresponding mounting holes (not shown) in the PCB 8. Thus, the card 9 inserted in the connector 2 is interconnected with the PCB 8 through the terminals 30, 31 of the header 20 and the female terminals 76 of the alignment socket 70. The alignment socket 70 further comprises a plurality of channels 78 formed in a rear surface 77 thereof proximate the passages 71. A shielding shell 79 has a plurality of shielding fingers disposed in the corresponding channels 78 for engaging with the corresponding grounding finger 500 of the grounding plate 50. Thus, a grounding path is formed between the connector 2 and the PCB 8 through the grounding plate 50 and the shielding shell 79.

In assembly, the tail portions 33 of the upper and lower rows of the terminals 30, 31 are inserted into the corresponding passages 74, 75 of the alignment socket 70 seated on the PCB 8. Since the alignment socket 70 has a step-like shape, the terminals 30, 31 are slightly bent upward to be inserted into the corresponding passages 74, 75 of the alignment socket 70 without being upwardly bent a significant distance. The grounding plate 50 is then positioned over a top surface 24 of the header 20 with the resilient grounding fingers 500 thereof received in the corresponding channels 78 of the alignment socket 70 whereby the grounding fingers 500 engage with the corresponding shielding fingers of the shielding shell 79. The shield 40 with the card ejection mechanism 60 mounted thereon is then lowered onto the assembled components as described above and secured together by two sets of bolts and nuts (not shown).

By such a design, the terminals 30, 31 are only upwardly bent a small distance for insertion into the corresponding passages 74, 75 formed through the upper and lower stepped surfaces 71, 72 of the alignment socket 70. Correspondingly, the shield 40 need not be bent upward for cooperating with the upwardly bent contacts 30, 31. Therefore, a distance $D_2$ defined between the header 20 and the alignment socket 70 is significantly smaller than the conventional distance $D_1$ as shown in FIG. 1. Thus, the length of the connector 2 is significantly reduced thereby reducing occupied area of the connector 2 on the PCB 8. Simultaneously, the height of the connector 2 is significantly decreased.

Figure 4:
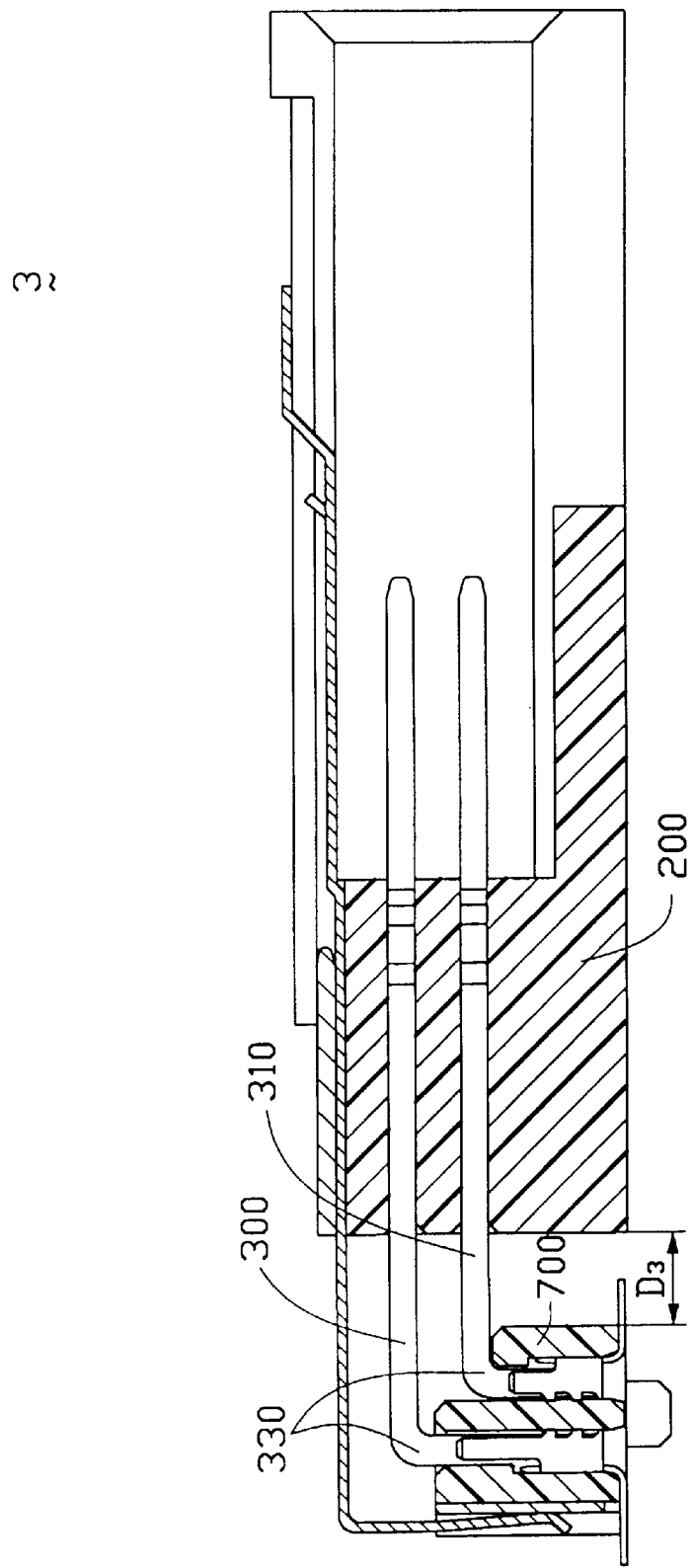
FIG. 4 is a vertical cross-sectional view of an assembled PCMCIA card connector in accordance with a second embodiment of the present invention.

A PCMCIA card connector 3 in accordance with a second embodiment of the present invention is shown in FIG. 4. The height of a header 200 of the connector 3 is slightly increased whereby tail portions 330 of upper and lower rows of terminals 300, 310 horizontally extend a distance and downwardly extend into an alignment socket 700 without being upwardly bent. A distance $D_3$ defined between the header 200 and the alignment socket 700 is significantly reduced compared to the conventional distance $D_1$ as shown in FIG. 1 thereby significantly reducing the occupied area of the connector 200 on the PCB 8. The height of the connector 200 is also significantly decreased. Since other components of the second embodiment are similar to those of the first embodiment, a detailed description thereof is omitted herein.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

We claim:

1. A card connector having a reduced length for interconnecting an inserted electrical card with a printed circuit board on which the card connector is mounted, comprising:

a header adapted for accommodating the electrical card;

a plurality of terminals retained in the header and arranged in an upper row and a lower row, each terminal including a forwardly extending pin portion for mating with a corresponding contact of the electrical card and a tail portion rearwardly and downwardly extending from the header;

a step-like alignment socket having an upper surface and a lower surface each defining a plurality of passages therein, the passages being arranged in a front row and a rear row for receiving the terminals; and a plurality of female terminals retained in the passages of the alignment socket, each female terminal including a contact portion for mating with the tail portion of the corresponding terminal and a solder portion for being soldered to the printed circuit board, wherein the tail portion of each terminal horizontally extends a distance and downwardly extends into a corresponding passage of the alignment socket;

further comprising a grounding plate for covering the header and the alignment socket, the grounding plate having a plurality of grounding fingers downwardly extending therefrom, and wherein the alignment socket comprises a plurality of channels formed in the upper surface proximate the rear row of passages and a shielding shell having a plurality of shielding fingers retained in the corresponding channels for engaging with the corresponding grounding fingers of the grounding plate.

2. A card connector for interconnecting an inserted electronic card with a printed circuit board on which the card connector is mounted, comprising:

a header adapted to accommodate the inserted card;

a plurality of first terminals retainably horizontally extending in the header and arranged in an upper row and a lower row, each of said first terminals including a forwardly extending pin portion for mating with a corresponding contact of the inserted card and a tail portion generally rearwardly and downwardly extending out of the header;

an alignment socket defining front and rear rows of vertically extending passages, said passages in the front row being closer to the header than that in the rear row;

a plurality of second female terminals positioned in the corresponding passages, respectively, each of said second terminals including a vertical contact portion engaging with the tail portion of the corresponding first terminal and a horizontal solder portion for being soldered to the printed circuit board, wherein the contact portion of the second terminal in the passage of the rear row is larger and taller than that in the passage of the front row for engagement with the corresponding first terminal in the upper row which has a longer vertical dimension than the first terminal in the lower row.

3. A card connector for interconnecting an inserted electronic card with a printed circuit board on which the card connector is mounted, comprising:

a header adapted to accommodate the inserted card;

a plurality of first terminals retainably horizontally extending in the header and arranged in an upper row and a lower row, each of said terminals including a forwardly extending pin portion for mating with a corresponding contact of the inserted card and a tail portion generally rearwardly and downwardly extending out of the header;

a step-like alignment socket including an upper surface and a lower surface, rear and front rows of vertically extending passages respectively extending downward therefrom, said passages in the front row being closer to the header than that in the rear row;

a plurality of second female terminals positioned in the corresponding passages, respectively, for respective engagement with the tail portions of the corresponding first terminals, wherein a curved top portion of the tail portion of the first terminal in the lower row extends within a range between the upper surface and the lower surface, the female terminals in the rear row being taller than those of the front row.

* * * * *